United States Patent
Tzu et al.

(10) Patent No.: US 7,033,947 B2
(45) Date of Patent: Apr. 25, 2006

(54) DUAL TRENCH ALTERNATING PHASE SHIFT MASK FABRICATION

(75) Inventors: San-De Tzu, Taipei (TW); Ming-Shuo Yen, Pingchen (TW); Chung-Hsing Chang, Hsin-chu (TW)

(73) Assignee: Taiwan Semiconductor Manufacturing Co Ltd, Hsin Chu (TW)

( * ) Notice: Subject to any disclaimer, the term of this patent is extended or adjusted under 35 U.S.C. 154(b) by 262 days.

(21) Appl. No.: 10/385,764

(22) Filed: Mar. 11, 2003

(65) Prior Publication Data

US 2004/0180548 A1 Sep. 16, 2004

(51) Int. Cl.
*H01L 21/302* (2006.01)
(52) U.S. Cl. .................. 438/706; 438/700; 438/717; 216/47
(58) Field of Classification Search ................ 438/706, 438/710, 717, 720, 312, 700; 216/12, 41, 216/47; 430/5, 311, 312, 316
See application file for complete search history.

(56) References Cited

U.S. PATENT DOCUMENTS

| | | | | |
|---|---|---|---|---|
| 6,159,642 A | * | 12/2000 | Kawano et al. | 430/5 |
| 6,528,216 B1 | * | 3/2003 | Park | 430/5 |
| 6,635,393 B1 | * | 10/2003 | Pierrat | 430/5 |

* cited by examiner

*Primary Examiner*—Lan Vinh
(74) *Attorney, Agent, or Firm*—Tung & Associates

(57) ABSTRACT

Fabricating a dual-trench alternating phase shift mask (PSM) is disclosed. A chromium layer over a mask layer, which is over a quartz layer, of the PSM is patterned according to a semiconductor design. The mask layer is dry etched according to deep trenches of a PSM design. The quartz layer is dry etched a first number of times through a first photoresist layer applied over the chromium layer and patterned according to the deep trenches of the PSM design by using backside ultraviolet exposure. The mask layer is dry etched again, according to shallow trenches of the PSM design. The quartz layer is dry etched a second number of times through a second photoresist layer applied over the chromium layer and patterned according to the shallow trenches of the PSM design by using backside ultraviolet exposure.

13 Claims, 20 Drawing Sheets

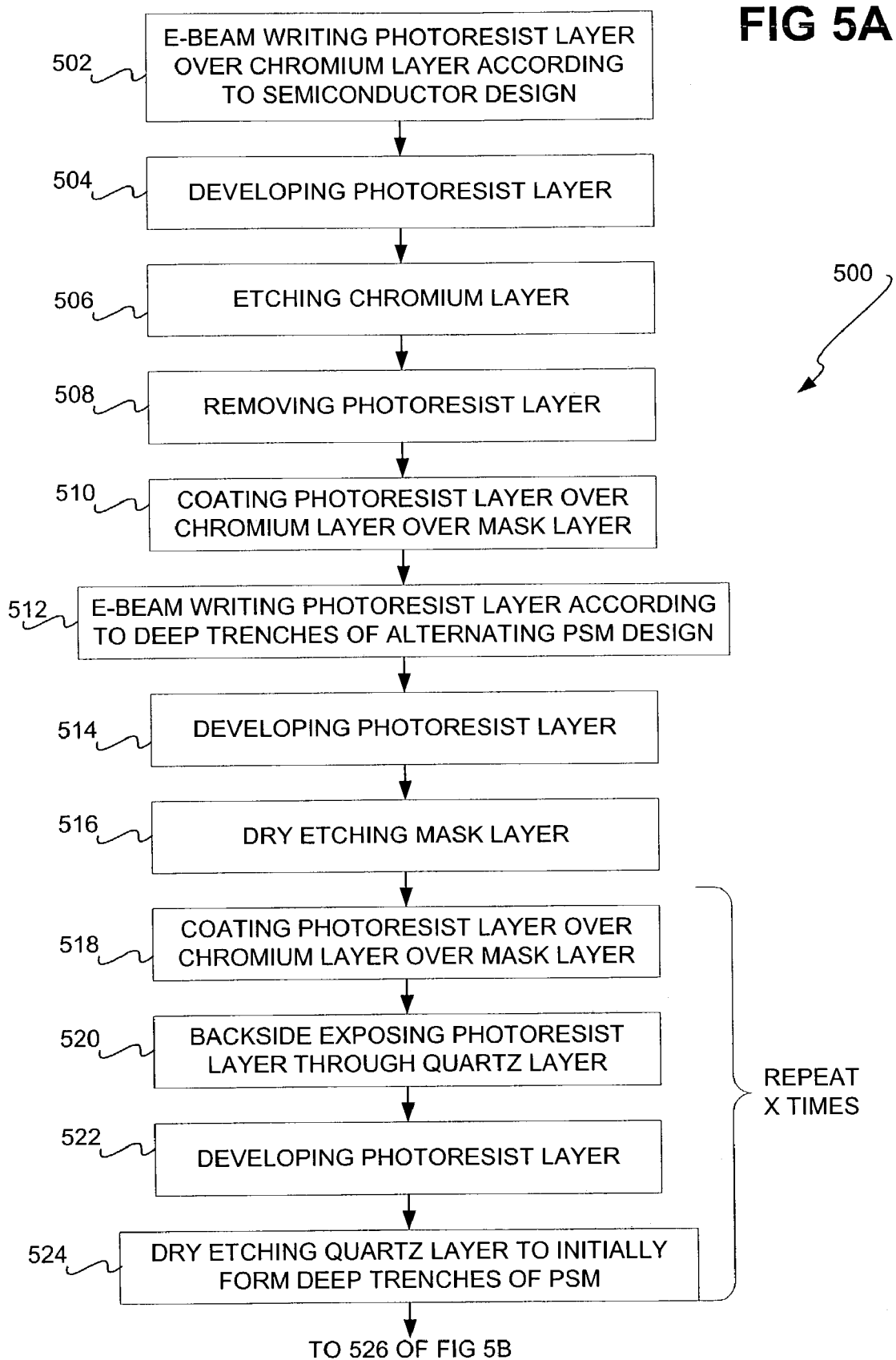

600

600

DUAL TRENCH ALTERNATING PHASE SHIFT MASK FABRICATION

FIELD OF THE INVENTION

This invention relates generally to semiconductor device fabrication, and more particularly to the use of phase shift masks (PSM's) in conjunction with such fabrication.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on lithographic processes. Resolution of anything smaller than a wavelength is generally quite difficult. Pattern fidelity can deteriorate in sub-wavelength lithography. The resulting features may deviate significantly in size and shape from the ideal pattern drawn by the circuit designer. For example, as two mask patterns get closer together, diffraction problems occur. At some point, the normal diffraction of the exposure rays start touching, leaving the patterns unresolved in the resist. The blending of the two diffraction patterns into one results from all the rays being in the same phase. Phase is a term that relates to the relative positions of a wave's peaks and valleys. In FIG. 1A, the waves 102 and 104 are in phase, whereas in FIG. 1B, the waves 106 and 108 are out of phase.

One way to prevent the diffraction patterns from affecting two adjacent mask patterns is to cover one of the openings with a transparent layer that shifts one of the sets of exposing rays out of phase, which in turn nulls the blending. This is shown in FIGS. 2A and 2B. In FIG. 2A, the mask 202 causes an undesirable light intensity as indicated by the line 204. In FIG. 2B, adding the phase shifter 206 to the mask 202 causes a desirable light intensity as indicated by the line 208. This mask 202 in FIG. 2B with the phase shifter 206 added is a phase shift mask (PSM), which is a special type of photomask.

A typical photomask affects only one of the properties of light, the intensity. Where there is chromium, which is an opaque region, an intensity of zero percent results, whereas where the chromium has been removed, such that there is a clear or transparent region, an intensity of substantially 100 percent results. By comparison, a PSM not only changes the intensity of the light passing through, but its phase as well. By changing the phase of the light by 180 degrees in some areas, the PSM takes advantage of how the original light wave adds to the 180-degree wave to produce zero intensity as a result of destructive interference.

PSM's have gained increased popularity among manufacturers as the feature sizes they are tasked with printing become smaller, and the topography over which these features must be printed becomes more varied. PSM's offer their customers the opportunity to greatly improve the resolution capability of their steppers. This allows them to print smaller feature sizes using the same equipment and processes.

One particular type of PSM is referred to as an alternating PSM. The PSM of FIG. 2B was one example of an alternating PSM. In an alternating PSM, closely spaced apertures are processed so that light passing through any particular aperture is 180 degrees out of phase from the light passing through adjacent apertures. Any light that spills over into the dark region from the two edges that are out of phase will destructively interfere. This reduces the unwanted exposure in the center dark region.

FIG. 3 shows another example of an alternating PSM, and more specifically, a dual-trench alternating PSM 300. The PSM 300 includes two layers, a chromium layer 302, and a quartz layer 304. The chromium layer 302 is the same type of layer typically found in other, non-PSM photomasks, in which light is exposed therethrough to an underlying semiconductor wafer. Clear regions within the chromium layer 302 allow light to pass through, whereas opaque regions within the chromium layer 302 prevent light from passing through. The clear and opaque regions are arranged to correspond to a desired semiconductor design, or pattern. In the PSM 300, there are clear regions 306A, 306B, 306C, 306D, and 306E.

The quartz layer 304 is more generally a clear or transparent layer, in which different-sized trenches are alternatively added beneath the clear regions of the chromium layer 302 to phase shift light passing through these clear regions. For instance, the alternating clear regions 306A, 306C, and 306E of the chromium layer 302 have shallow trenches beneath them in the quartz layer 304. Conversely, the alternating regions 306B and 306D of the chromium layer 302 have deep trenches beneath them in the quartz layer 304. The PSM 300 is an alternating PSM in that the PSM design repeats on an alternating basis for clear regions of the chromium layer 302, such that one clear region has a shallow trench beneath it, whereas the next clear region has a deep trench beneath it, and so on. The PSM 300 is a dual-trench alternating PSM in that there are two trenches that repeat, a shallow trench and a deep trench.

The manner by which the PSM 300 of FIG. 3 can be fabricated according to the prior art is summarized with reference to FIGS. 4A–4I. In FIG. 4A, the clear regions within the chromium layer 302 are already present, by a process of photoresist patterning in which the photoresist is first exposed by e-beam writing and then developed, etching the chromium layer 302, and then stripping the remaining photoresist. A new layer of photoresist 402 has been added, such as by a coating process. In FIG. 4B, the layer of photoresist 402 is exposed to correspond to the deep trenches 306B and 306D. The exposure is accomplished by e-beam writing. In FIG. 4C, exposed areas of the photoresist 402 are developed to remove them, and in FIG. 4D, the quartz layer 304 is dry etched to initially form the deep trenches 306B and 306D.

The quartz layer 304 is dry etched for 60 degrees, so that if there are defects within the quartz layer 304, only 60 degrees of such defects will be present. This amount is minimal, and will not affect printing of the semiconductor device using the PSM 300. The process of FIGS. 4A–4D is repeated for a total of three times, so that a total of 180 degrees of phase shift is achieved within the quartz layer 304.

In FIG. 4E, another layer of photoresist 402 is added, such as by a coating process. In FIG. 4F, the layer of photoresist 402 is exposed to correspond to all the trenches 306A, 306B, 306C, 306D, and 306E. The exposure is accomplished by e-beam writing. In FIG. 4G, exposed areas of the photoresist 402 are developed to remove them, and in FIG. 4H, the quartz layer 304 is dry etched to completely form the deep trenches 306B and 306D that were previously initially formed, as well as to completely form the shallow trenches 306A, 306C, and 306E.

The quartz layer 304 is again dry etched for 60 degrees, so that if there are defects within the quartz layer 304, only 60 degrees of such defects will be present. The process of FIGS. 4E–4H is repeated for a total of four times. Once the fourth time is finished, the remaining photoresist 402 is removed, such that the final PSM 300 remains, as has already been shown in FIG. 3.

This conventional approach to manufacturing the dual-trench alternating PSM 300 has several disadvantages, however. Overlay errors can error between successive exposures of the photoresist, such as between successive e-beam writings. These overlay errors induce anti-reflective layer loss around the etched regions, which can be difficult to discover during inspection. Because photoresist is exposed for a total of eight times, there are eight such successive e-beam writings, and the potential for overlay error inducing anti-reflective layer loss is great. Furthermore, e-beam writing in particular can be a time-consuming and/or costly process, such that fabricating the PSM 300 will be a lengthy and/or costly process since e-beam writing is used eight times.

Therefore, there is a need for a process for fabricating a dual-trench alternating PSM that overcomes the problems associated with manufacturing such PSM's in the prior art. Such a process should minimize the use of e-beam writers as much as possible. Minimizing the use of e-beam writers will allow such a process to avoid as much as possible overlay errors inducing anti-reflective layer loss. Furthermore, such minimization will decrease the time and/or the cost in fabricating dual-trench alternating PSM's. For these and other reasons, there is a need for the present invention.

SUMMARY OF THE INVENTION

The invention relates to fabricating a dual-trench alternating phase shift mask (PSM). An opaque layer over a mask layer, which is itself over a transparent layer, of the PSM is patterned according to a semiconductor design. The opaque layer may be a chromium layer, whereas the transparent layer may be a quartz layer. The mask layer is dry etched according to deep trenches of an alternating PSM design to remove the mask layer therefrom. The transparent layer is dry etched a first number of times through a first photoresist layer applied over the opaque layer and patterned according to the deep trenches of the alternating PSM design by using backside ultraviolet exposure. This initially forms deep trenches of the PSM. The mask layer is dry etched again, according to shallow trenches of the alternating PSM design to remove the mask layer therefrom. The transparent layer is dry etched a second number of times through a second photoresist layer applied over the opaque layer and patterned according to the shallow trenches of the alternating PSM design by using backside ultraviolet exposure. This completely forms shallow trenches and the deep trenches of the PSM. The second photoresist layer is then removed.

The invention provides for advantages not found within the prior art. E-beam writing is significantly reduced in fabricating a dual-trench alternating PSM, as compared to the prior art, by instead using backside ultraviolet exposure. This significantly decreased overlay error, which means that induced anti-reflective layer loss is also significantly reduced. Backside ultraviolet exposure can be used because of the presence of the mask layer, which may be molybdenum silicon oxide (MoSiO), which prevents such exposure from affecting the chromium layer. The reduction in use of e-beam writing also means that the invention generates a dual-trench alternating PSM in a less costly and/or less time-consuming manner as compared to the prior art. Other advantages, embodiments, and aspects of the invention will become apparent by reading the detailed description that follows, and by referencing the attached drawings.

BRIEF DESCRIPTION OF THE DRAWINGS

FIGS. 5A and 5B are flowcharts of a method to fabricate an alternating dual-trench PSM according to an embodiment of the invention.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1A:
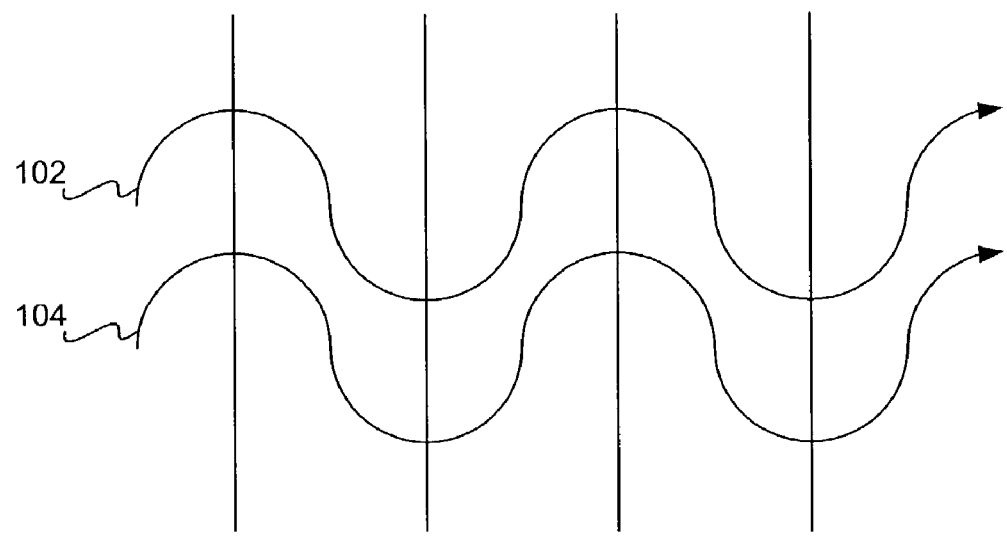
FIGS. 1A and 1B are diagrams showing the difference between in-phase and out-of-phase waves.
Figure 1B:
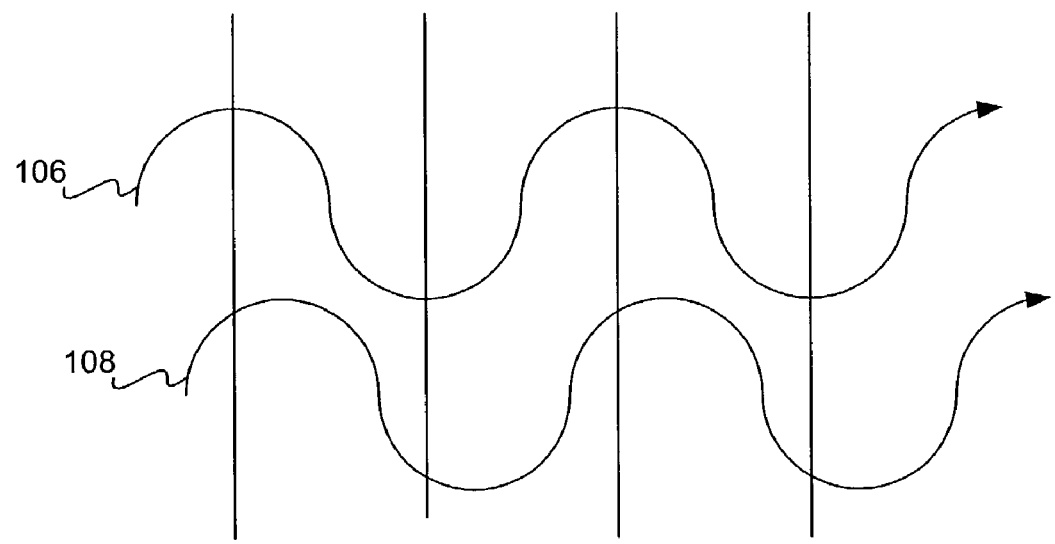
Figure 2A:
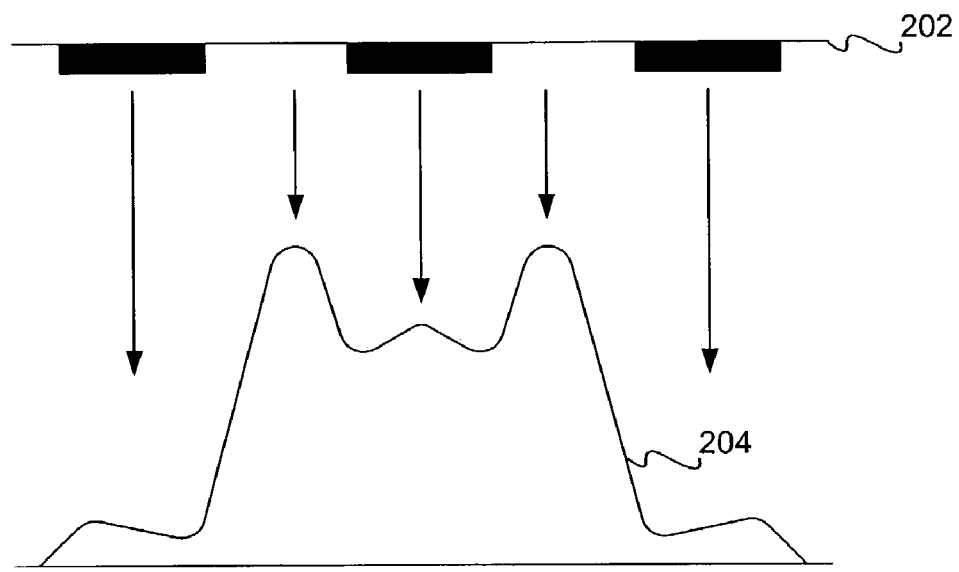
FIGS. 2A and 2B are diagrams showing the difference in the resulting light intensity between a photomask without phase shift and a photomask with phase shift.
Figure 2B:
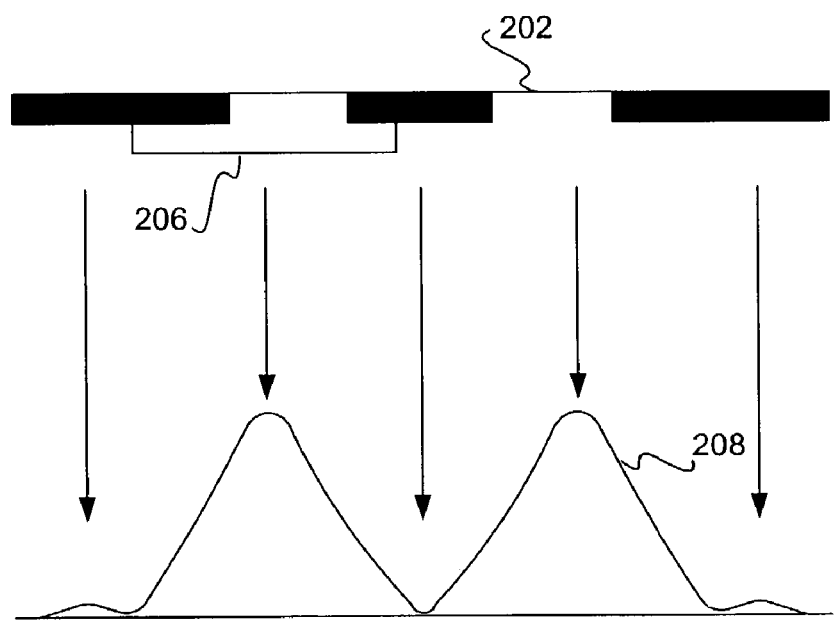
Figure 3:
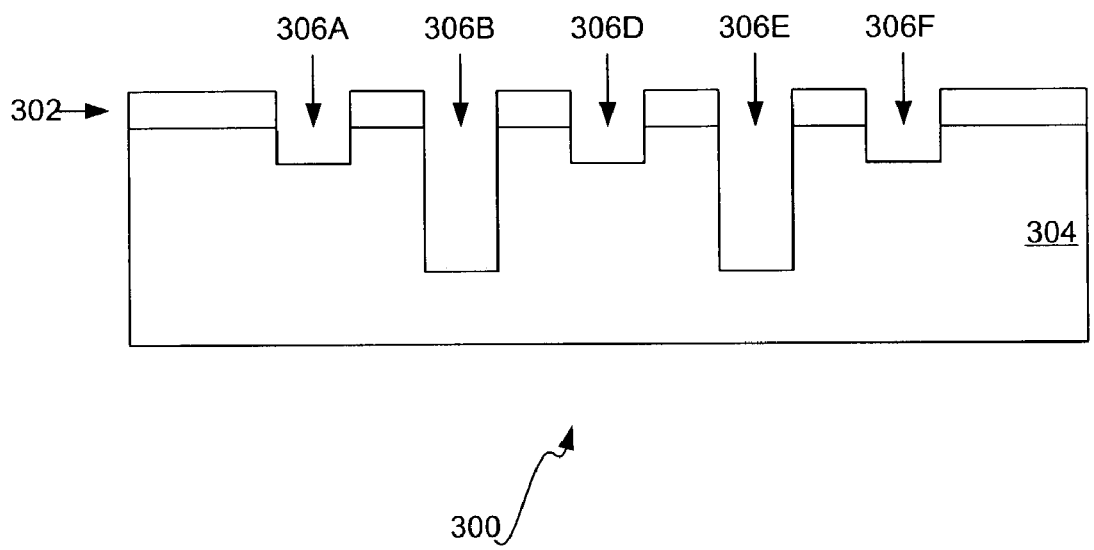
FIG. 3 is a diagram showing an example of an alternating dual-trench phase shift mask (PSM).
Figure 4A:
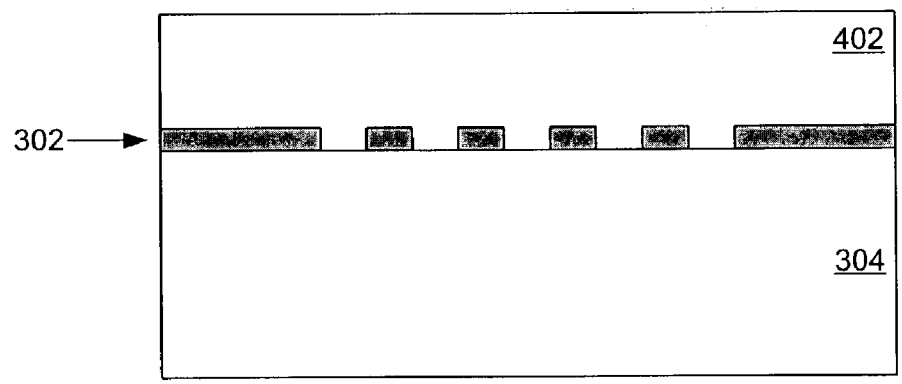
FIGS. 4A–4H are diagrams showing how the PSM of FIG. 3 can be conventionally manufactured according to the prior art.
Figure 4A:
Figure 4B:
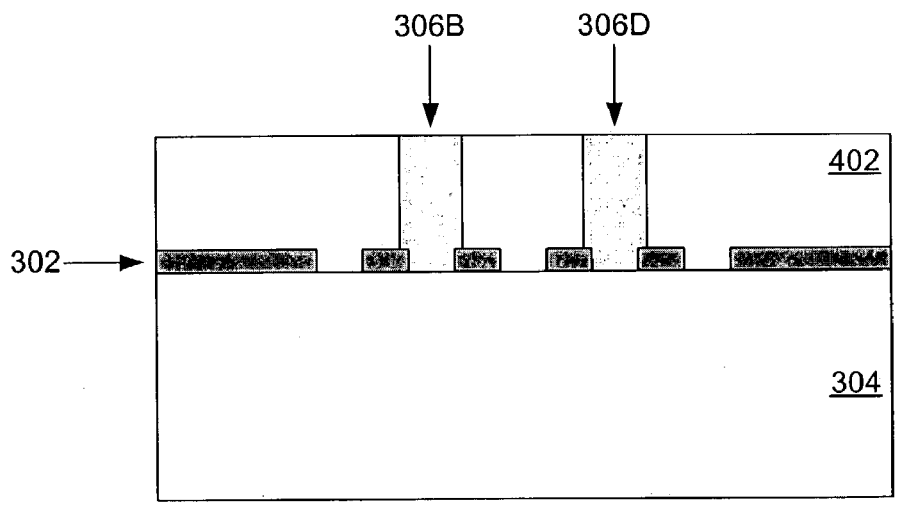
Figure 4B:
Figure 4C:
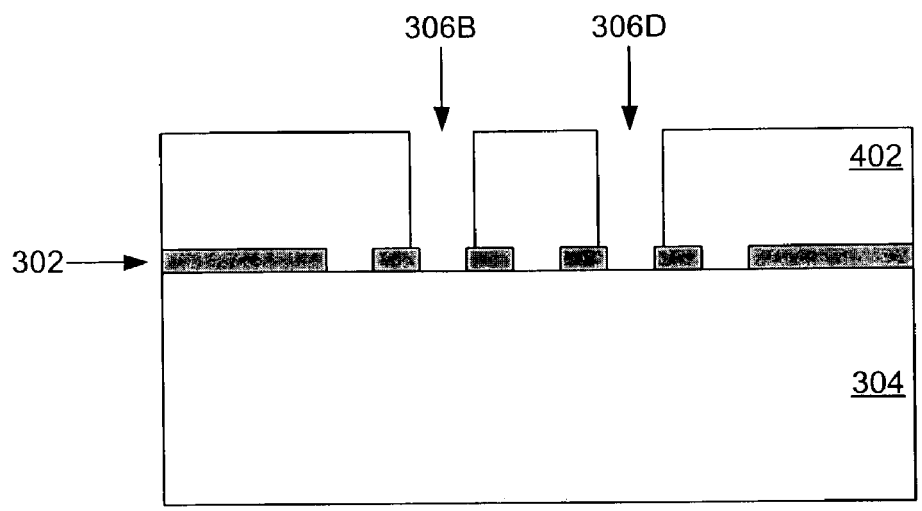
Figure 4C:
Figure 4D:
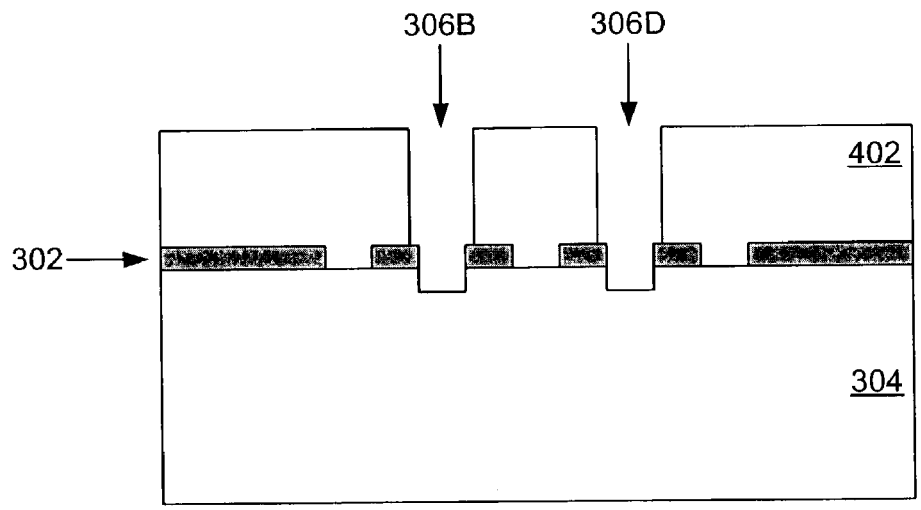
Figure 4D:
Figure 4E:
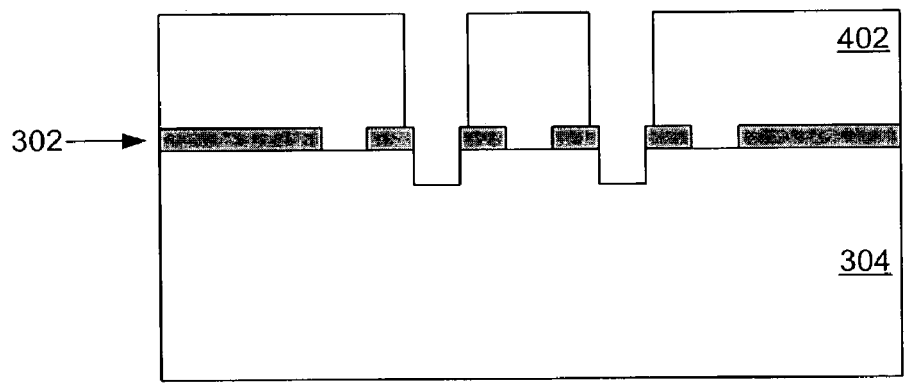
Figure 4E:
Figure 4F:
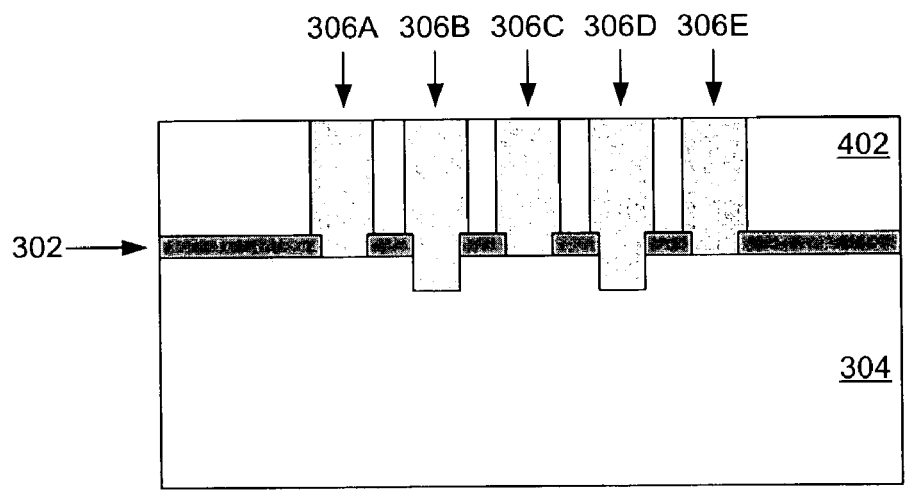
Figure 4F:
Figure 4G:
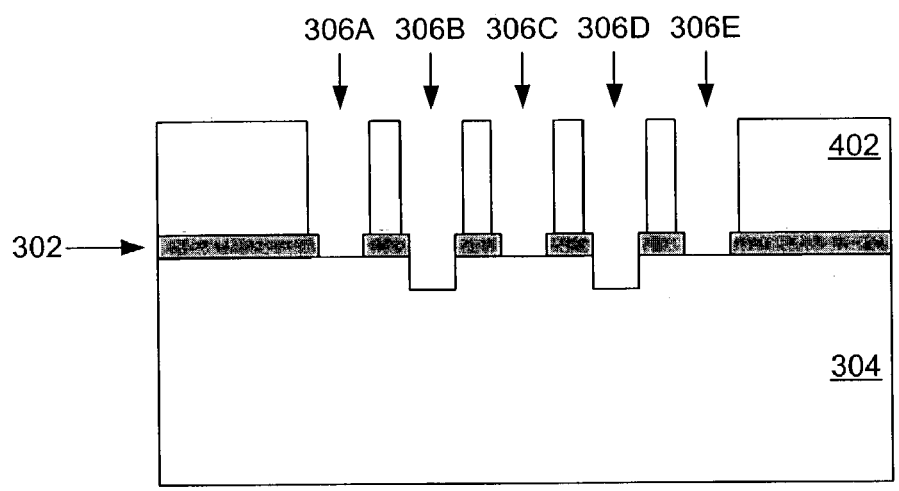
Figure 4G:
Figure 4H:
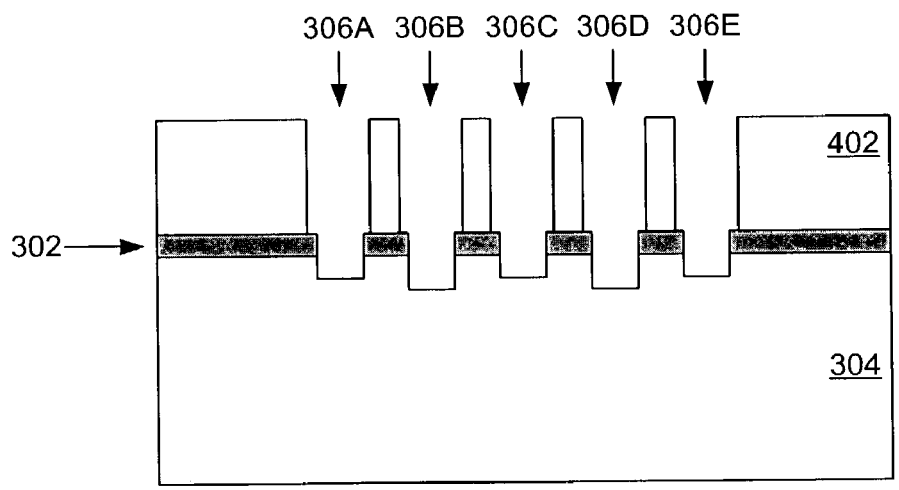
Figure 4H:
Figure 5B:
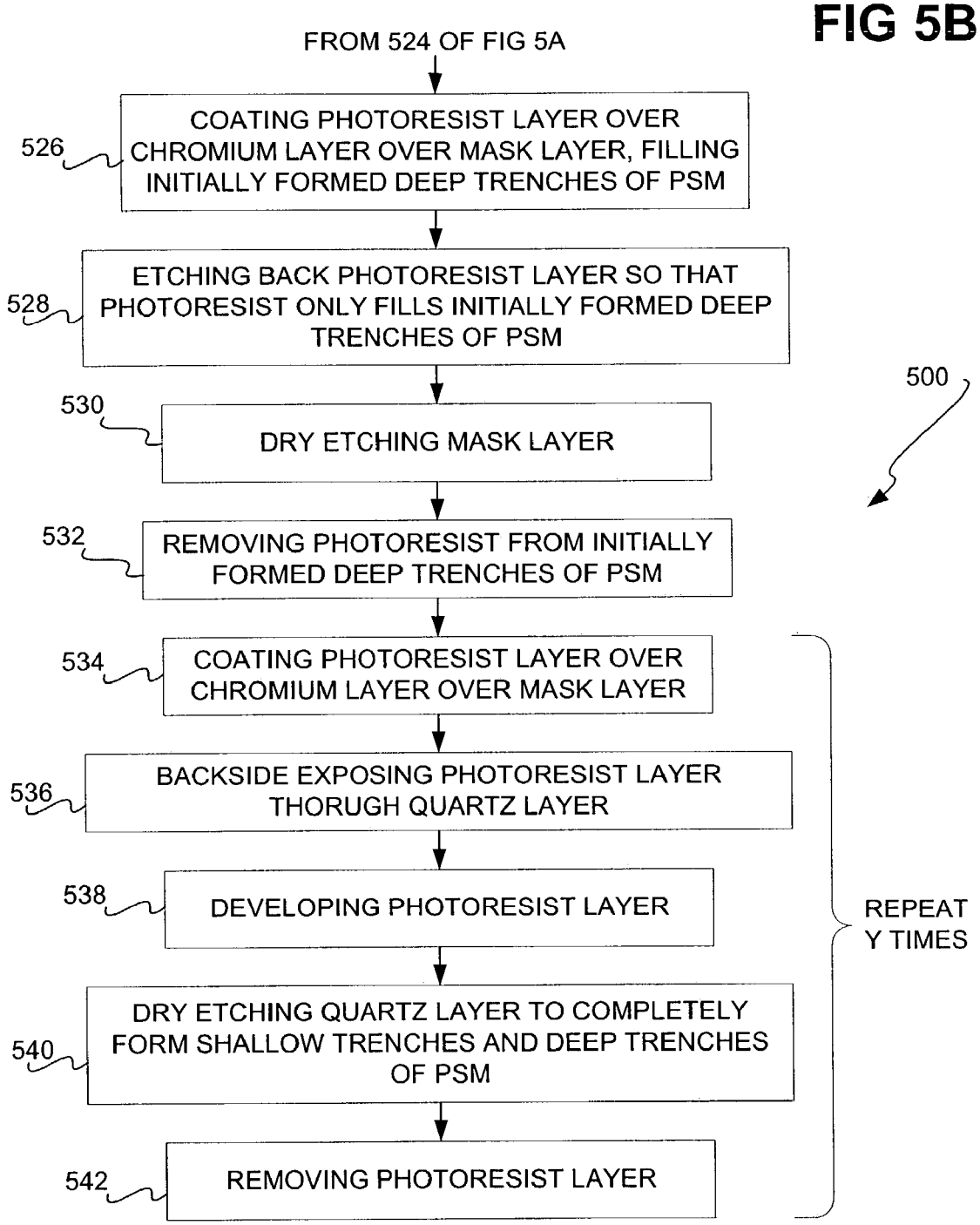

FIGS. 5A and 5B show a method 500 to construct a dual-trench alternating phase shift mask (PSM) according to an embodiment of the invention. In FIG. 5A, a photoresist layer over a chromium layer is first exposed according to a semiconductor design (502), such as by e-beam writing. The design is so that the PSM can ultimately be used to manufacture semiconductor devices of this design, by, for instance, photolithographic processes that use the PSM as the photomask. The photoresist layer is developed (504) to remove the exposed parts of the photoresist layer, and the chromium layer is etched (506) so that the chromium layer is itself patterned according to the semiconductor design. There is a mask layer beneath the chromium layer separating the chromium layer from a quartz layer. The photoresist layer is then removed (508).

Figure 6A:
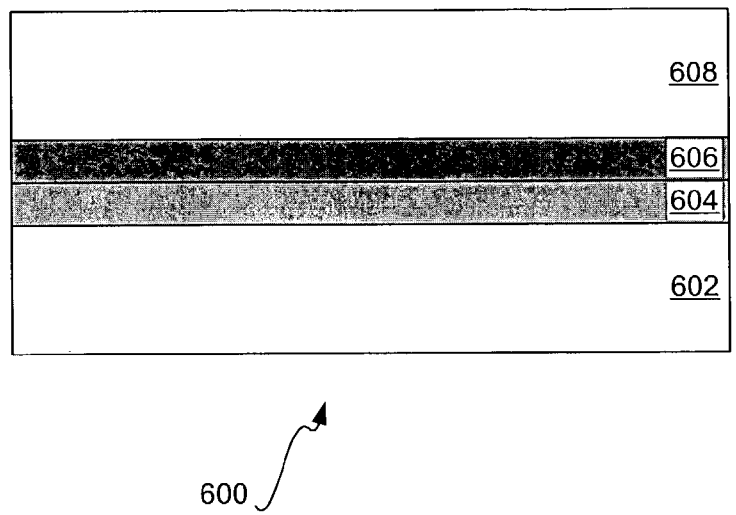
FIGS. 6A–6V are diagrams showing illustratively the method of FIG. 5.

Performance of 502, 504, 506, and 508 is shown illustratively with reference to FIGS. 6A–6E. In FIG. 6A, the PSM 600 begins as a quartz layer 602, with a hard mask layer 604 over the quartz layer 602, a chromium layer 606 over the hard mask layer 604, and a photoresist layer 608 over the chromium layer 606. The quartz layer 602 is generally a type of transparent or clear layer. The hard mask layer 604 may be molybdenum silicon oxide (MoSiO), or alternatively a different conductive etching stop layer. The chromium layer 606 is generally a type of opaque layer.

Figure 6B:
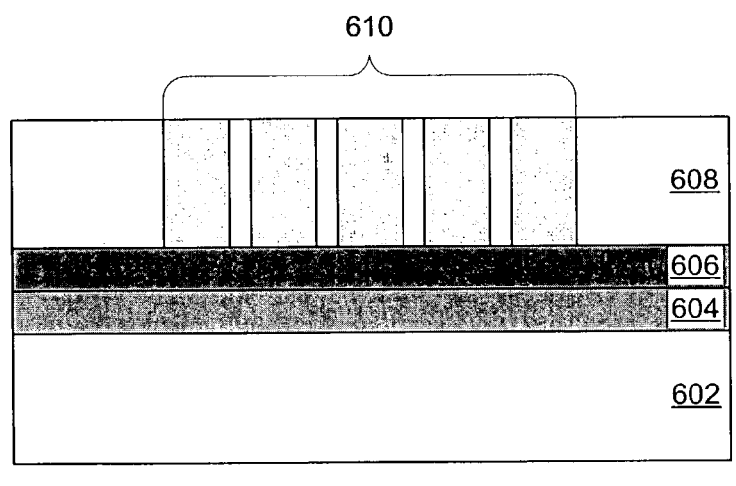
Figure 6C:
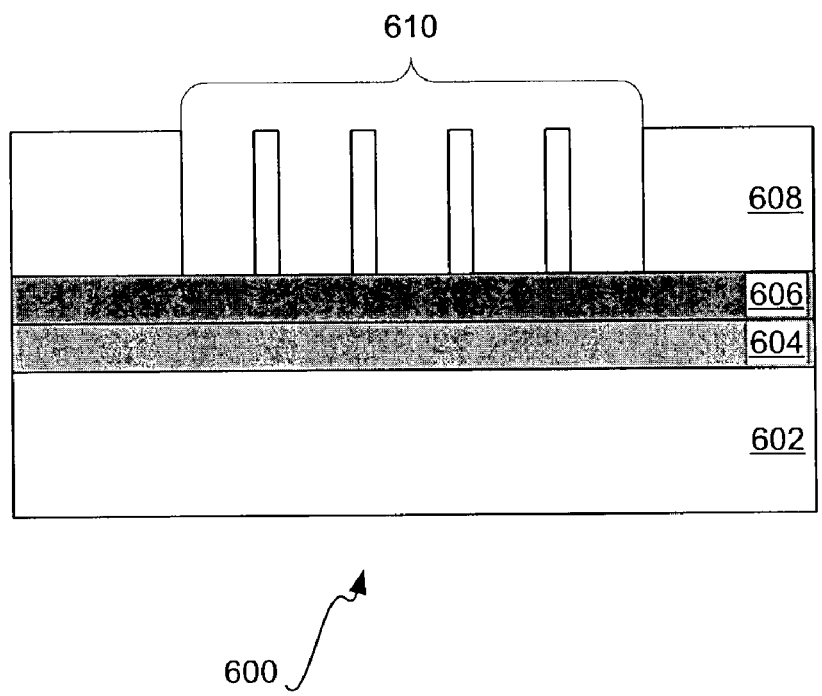
Figure 6D:
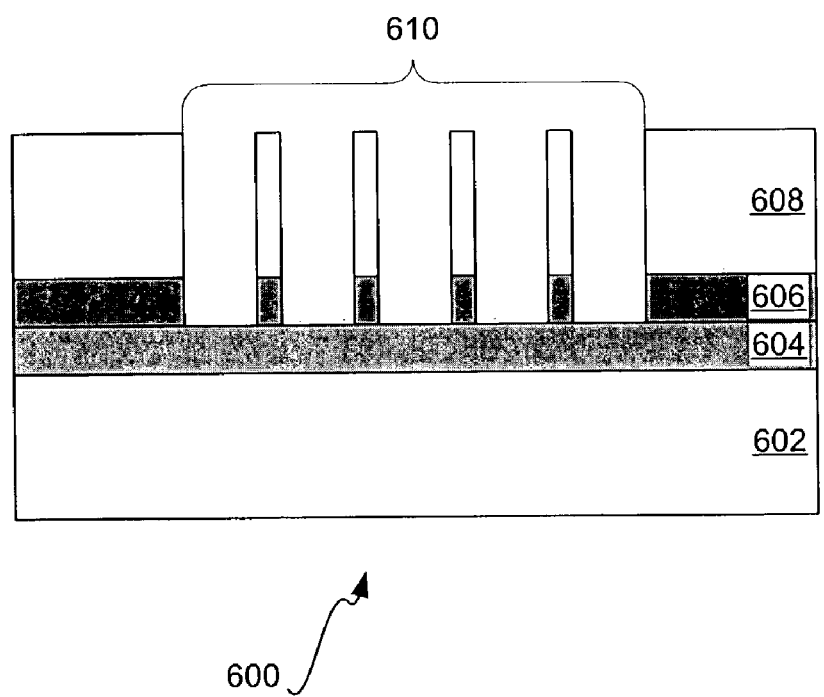
Figure 6E:
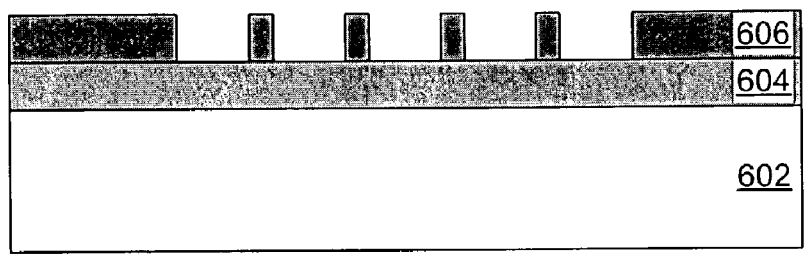

In FIG. 6B, the photoresist layer 608 is exposed according to the semiconductor design, as indicated by the regions 610. Exposure may be accomplished by e-beam or laser writing the semiconductor design in the photoresist layer 608, to result in the regions 610. In FIG. 6C, the photoresist is developed to remove those parts of the photoresist layer 608 that were exposed or written on, such that there is no longer photoresist within the regions 610. In FIG. 6D, the chromium layer 606 is etched down to the hard mask layer 604, to remove those parts of the chromium layer 606 that were exposed by exposure and development of the photoresist layer 608. Finally, the photoresist layer 608 is removed, such as by stripping, resulting in FIG. 6E, where the patterned chromium layer 606 remains over the layers 604 and 602.

Referring back to FIG. 5A, a new photoresist layer is next applied over the chromium layer (510). This can be accomplished by photoresist coating the chromium layer. The new photoresist layer is exposed according to deep trenches an alternating PSM design (512), and the photoresist layer is developed to remove the exposed parts of the layer (514). The alternating PSM design is so that a dual-trench alternating PSM results for the semiconductor design when the PSM is finished being fabricated. The mask layer is next dry etched (516), which removes the mask layer as exposed through the removed photoresist layer, such that the mask layer has been patterned according to the deep trenches of the alternating PSM design.

Figure 6F:
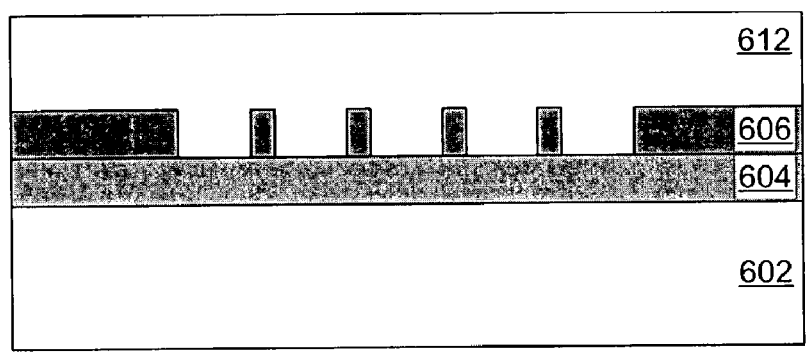
Figure 6G:
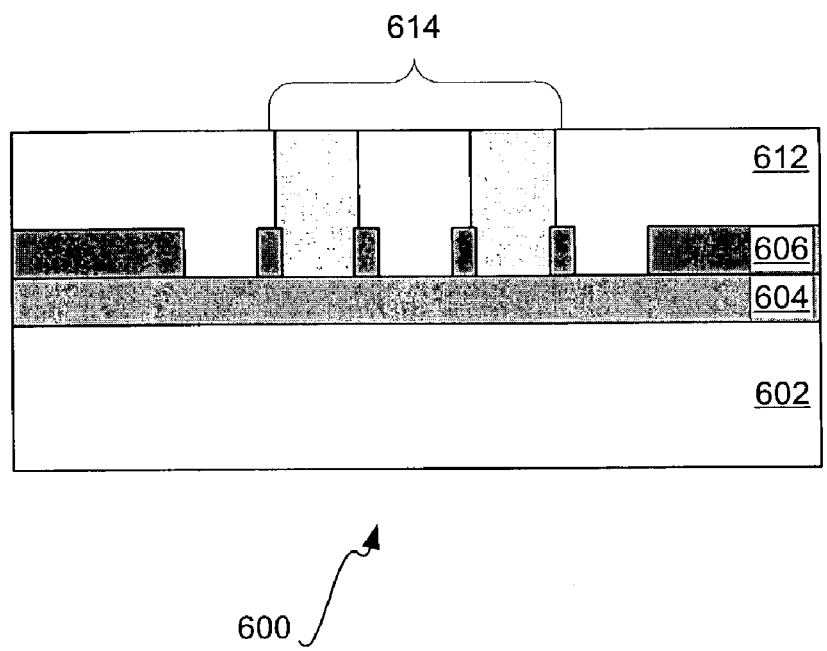
Figure 6H:
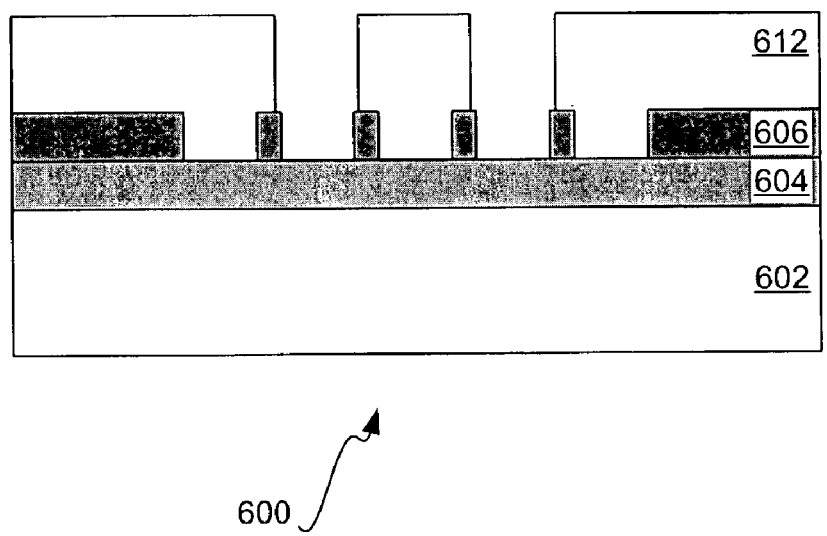
Figure 6I:
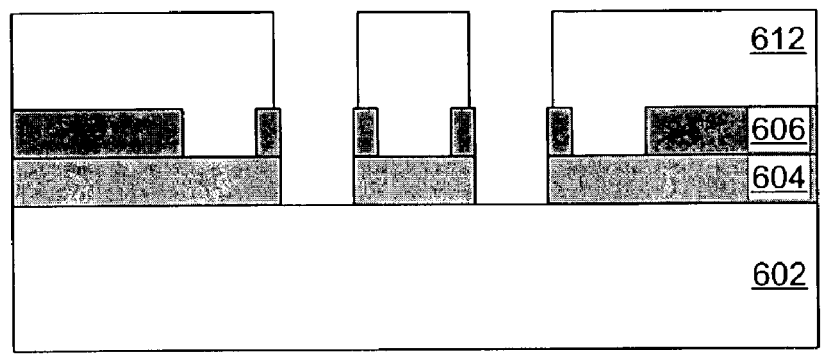

Performance of 510, 512, 514, and 516 is shown illustratively with reference to FIGS. 6F–6I. In FIG. 6F, the new photoresist layer 612 has been applied over the chromium layer 606. In FIG. 6G, the regions 614 result from exposure of the new photoresist layer 612, such as by e-beam or laser beam writing the alternating PSM design on the new photoresist layer 612. The underlying quartz layer 602 is not damaged by e-beam writing in particular, because of the presence of the mask layer 604. In FIG. 6H, the new photoresist layer 612 has been developed, such that the parts of the layer 612 that were written on or otherwise exposed are removed. The resulting photoresist layer 612 corresponds to the deep trenches of the alternating PSM design. In FIG. 6I, dry etching has been performed through the hard mask layer 604, resulting in removal of those parts of the hard mask layer 604 that were exposed, such that the hard mask layer 604 is patterned according to the deep trenches of the alternating PSM design.

Referring back to FIG. 5A, another photoresist layer is applied over the chromium layer (518). This can be accomplished by photoresist coating the chromium layer. The photoresist layer is backside exposed through the quartz layer (520), such as by using ultraviolet rays. The backside exposure reaches the photoresist layer because of the previously removed parts of the hard mask layer during dry etching. The photoresist layer is developed to remove the exposed parts of the photoresist layer (522), and the quartz layer is dry etched to initially form deep trenches of the PSM (524). The dry etching is performed preferably at 60 degrees, and 518, 520, 522, and 524 are repeated a number of times, such as three times, each at 60 degrees. This reduces defects in the quartz layer from affecting the ultimate printing of a semiconductor wafer using the PSM to fabricate a semiconductor device on the wafer, since any defect will only exist at 60 degrees, which is minimal enough not to affect the printing.

Figure 6J:
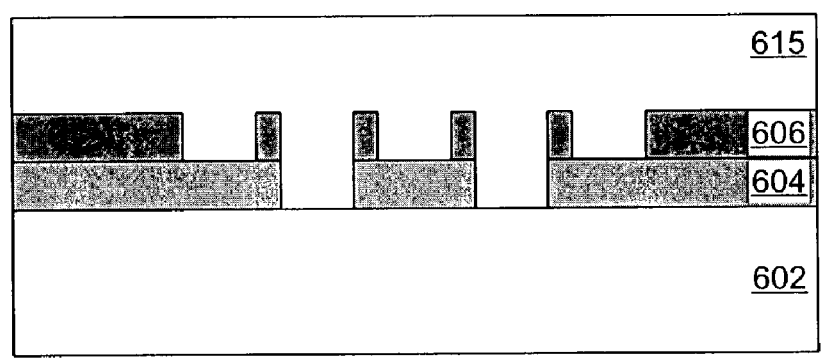
Figure 6K:
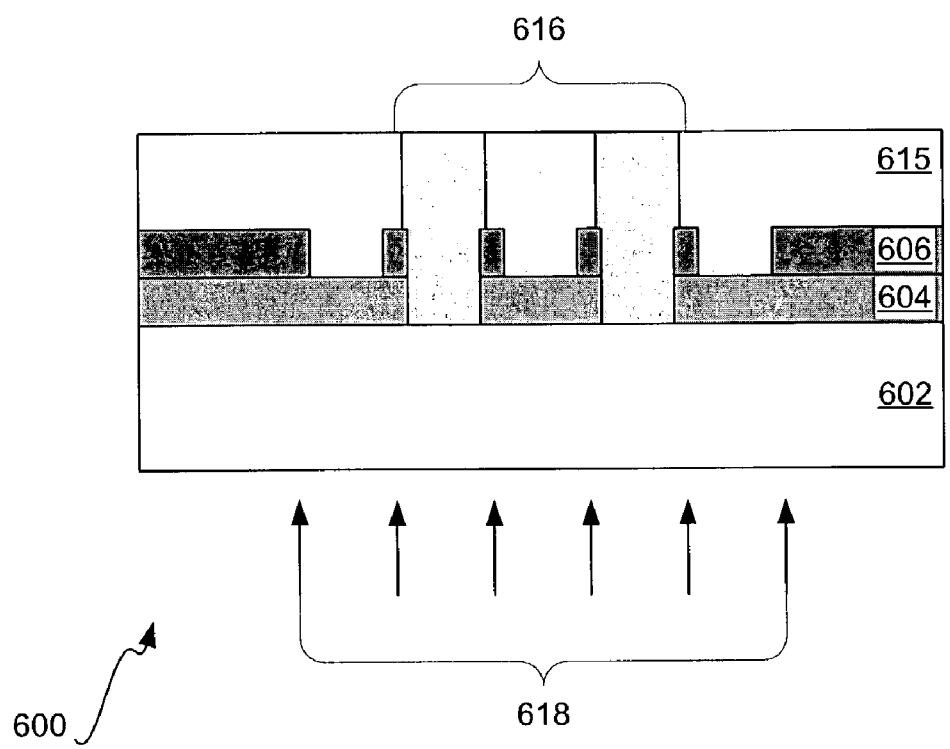
Figure 6L:
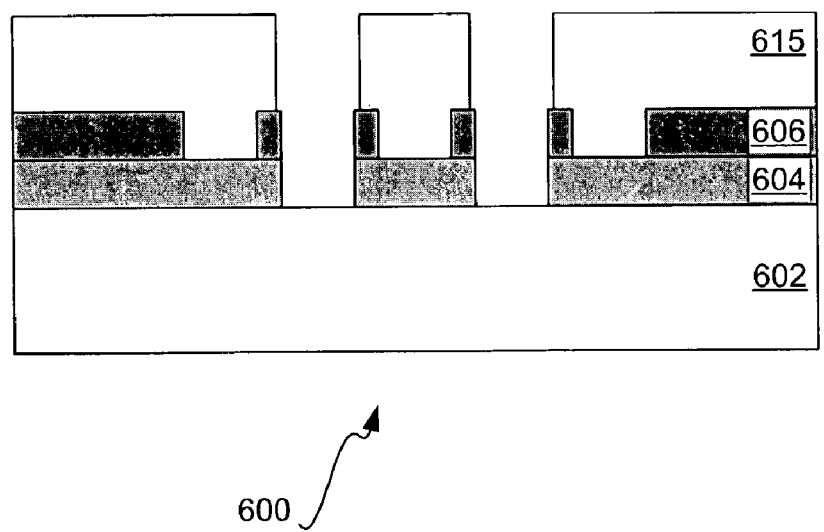
Figure 6M:
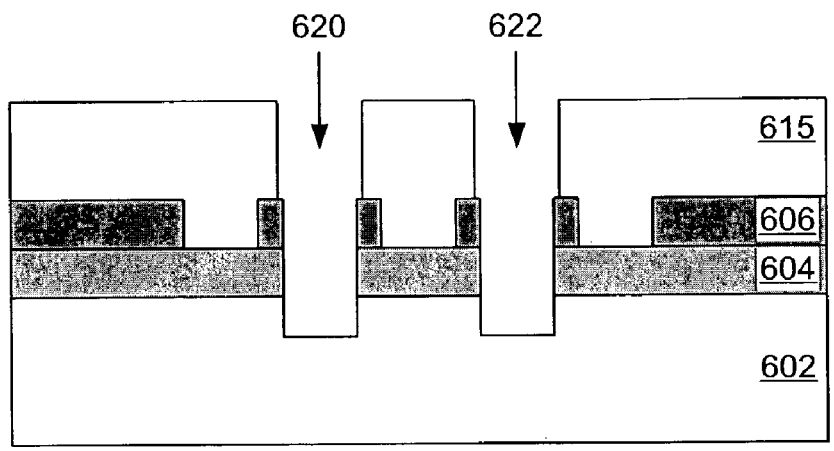
Figure 6M:

Performance of 518, 520, 522, and 524 is shown illustratively with reference to FIGS. 6J–6M. In FIG. 6J, another photoresist layer 615 has been applied over the chromium layer 606. In FIG. 6K, the photoresist layer 615 is exposed by backside exposure using ultraviolet, x-, or other types of rays 618. The exposure results in the regions 616 through the removed parts of the hard mask layer 604. Using backside exposure, instead of e-beam or laser beam writing, avoids the overlay errors that can result from beam writing, such that overlay-induced anti-reflective layer losses are also avoided. In FIG. 6L, the photoresist layer 615 has been developed, such that the parts of the layer 615 that were exposed are removed. The resulting photoresist layer 615 corresponds to the deep trenches of the alternating PSM design. In FIG. 6M, dry etching has been performed through the quartz layer 602, to initially form the deep trenches 620 and 622 of the PSM 600.

Referring to FIG. 5B, a new photoresist layer is next applied over the chromium layer (526). This can be accomplished by photoresist coating the chromium layer. The photoresist layer in particular fills the deep trenches that have been initially formed. Next, the photoresist layer is etched back (528), so that the only photoresist that remains is in the deep trenches. The mask layer is dry etched to remove exposed parts of the mask layer that correspond to the shallow trenches of the alternating PSM design (530). That is, the exposed parts of the mask layer that remain are those that correspond to the shallow trenches of the alternating PSM design, since the parts of the mask layer that correspond to the deep trenches of the alternating PSM design have already been dry etched away. The remaining photoresist that fills the initially formed deep trenches is then optionally removed, such as by photoresist stripping (532). Alternatively, rather than performing 526, 528, 530, and 532 as have been described, a negative photoresist coating may be applied, with backside exposure and subsequent dry etching and optional photoresist stripping, to achieve the same results.

Figure 6N:
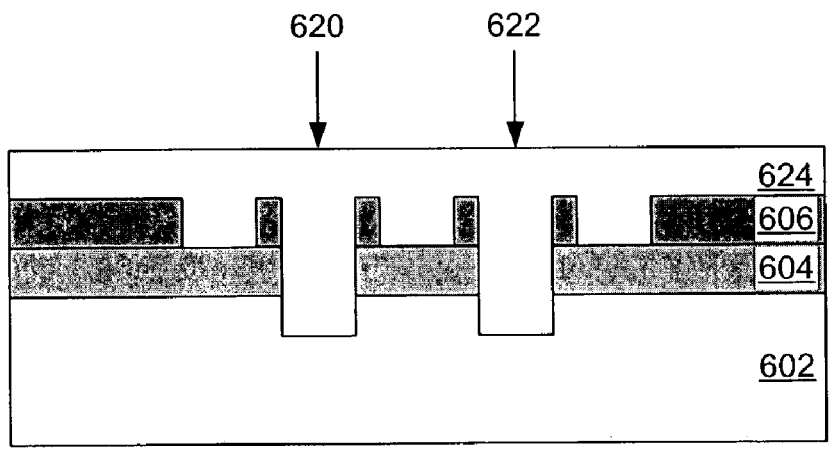
Figure 6N:
Figure 6O:
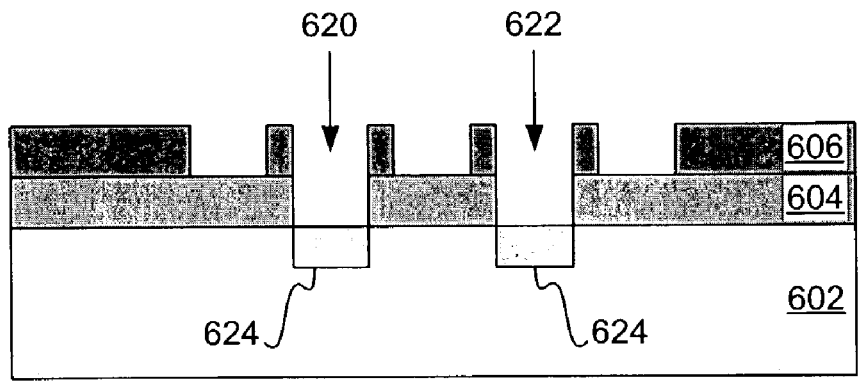
Figure 6O:
Figure 6P:
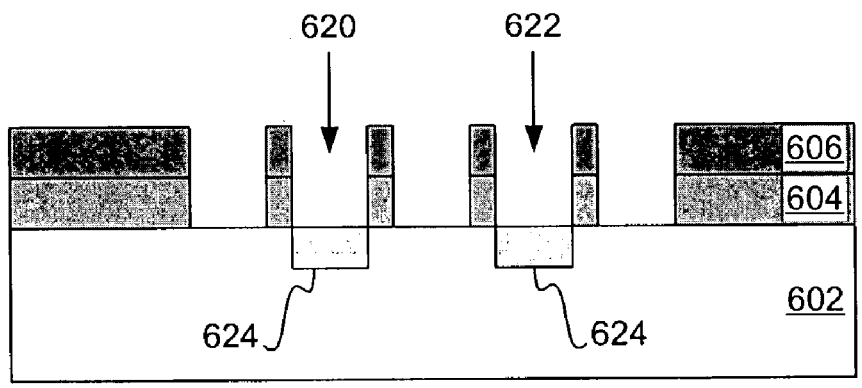
Figure 6P:
Figure 6Q:
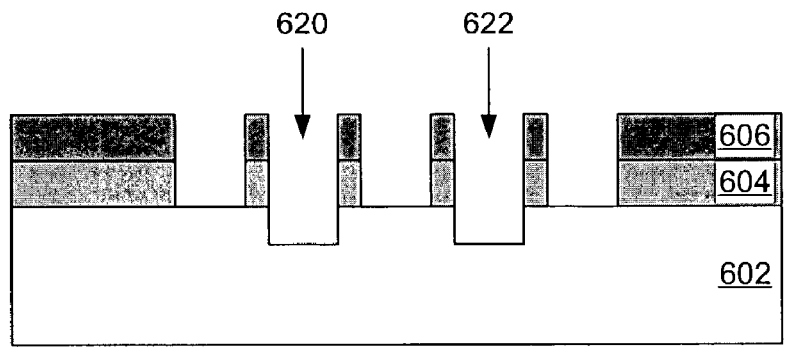
Figure 6Q:

Performance of 526, 528, 530, and 532 is shown illustratively with reference to FIGS. 6N–6Q. In FIG. 6N, the new photoresist layer 624 has been applied over the chromium layer 606, filling the trenches 620 and 622 that have been initially formed. In FIG. 6O, the photoresist layer 624 is etched back so that the only photoresist that remains is in the trenches 620 and 622 that have been initially formed. In FIG. 6P, dry etching has been performed through the hard mask layer 604, resulting in removal of those parts of the hard mask layer 604 that were exposed, such that the hard mask layer 604 as patterned now corresponds completely to the alternating PSM design. However, the only parts of the layer 604 most recently removed as shown in FIG. 6P correspond to the shallow trenches of the alternating PSM design, since those parts of the layer 604 that correspond to the deep trenches of the design were earlier removed. The presence of the photoresist in the deep trenches 620 and 622 initially formed protects the trenches from the etchant used to remove parts of the hard mask layer 604. Finally, in FIG. 6Q, the photoresist that was in the deep trenches 620 and 622 in FIG. 6P is removed, such as via stripping.

Referring back to FIG. 5B, another photoresist layer is applied over the chromium layer (534). This can be accomplished by photoresist coating the chromium layer. The photoresist layer is backside exposed through the quartz layer (536), such as by using ultraviolet rays. The backside exposure reaches the photoresist layer because of the previously removed parts of the hard mask layer during dry etchings. The photoresist layer is developed to remove the exposed parts of the photoresist layer (538), and the quartz layer is dry etched to completely form shallow trenches and the deep trenches of the PSM (540). The dry etching is performed preferably at 60 degrees, and 534, 536, 538, and 540 are repeated a number of times, such as four times, each at 60 degrees. This reduces defects in the quartz layer from affecting the ultimate printing of a wafer using the PSM to fabricate a device on the wafer, since any defect will only exist at 60 degrees, which is minimal enough not to affect the printing.

Figure 6R:
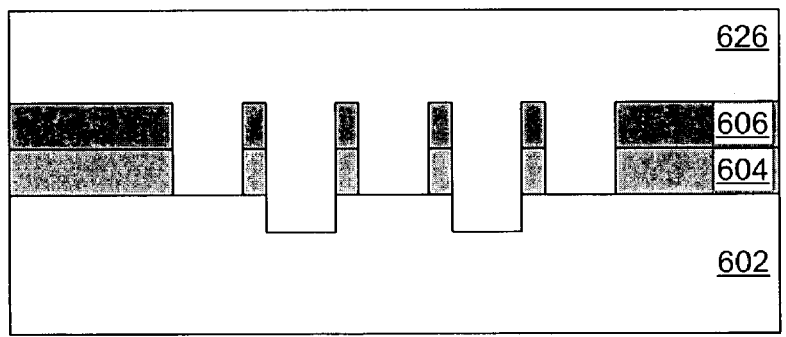
Figure 6R:
Figure 6S:
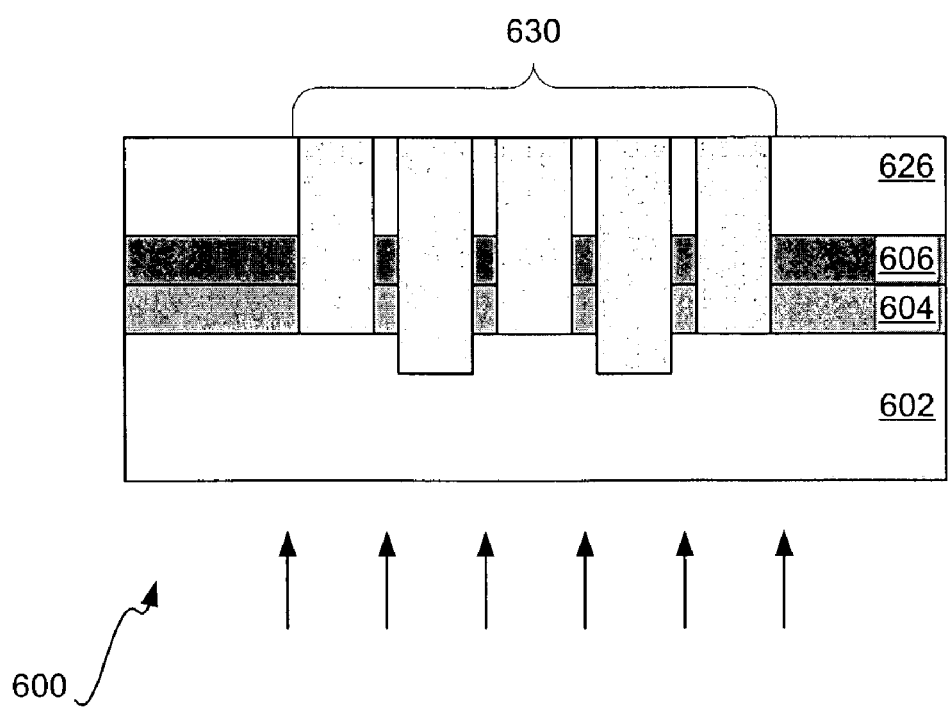
Figure 6T:
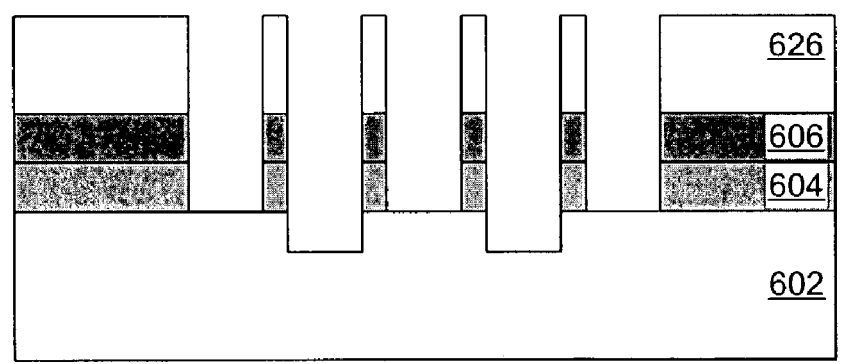
Figure 6U:
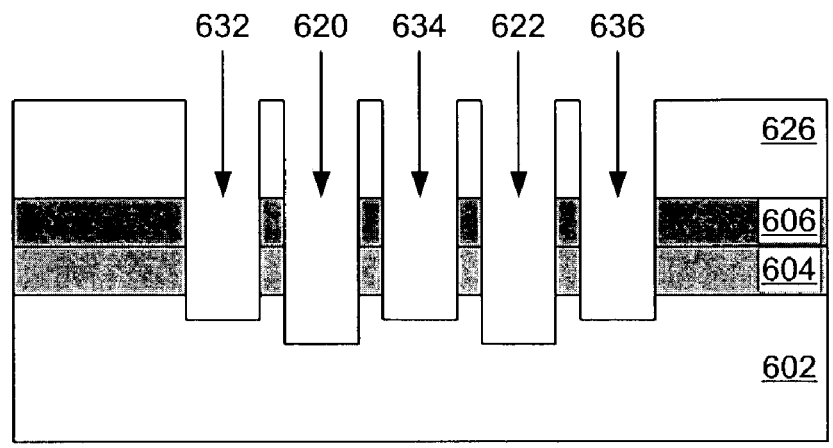
Figure 6U:

Performance of 534, 536, 538, and 540 is shown illustratively with reference to FIGS. 6R-6U. In FIG. 6R, another photoresist layer 626 has been applied over the chromium layer 606. In FIG. 6S, the photoresist layer 626 is exposed by backside exposure using ultraviolet, x-, or other types of rays 628. The exposure results in the regions 630 through the removed parts of the hard mask layer 604. Using backside exposure, instead of e-beam or laser beam writing, avoids the overlay errors that can result from beam writing, such that overlay-induced anti-reflective layer losses are avoided. In FIG. 6T, the photoresist layer 630 has been developed, such that the parts of the layer 630 that were exposed are removed. The resulting photoresist layer 630 corresponds to both the shallow trenches and the deep trenches of the alternating PSM design. That is, the resulting photoresist layer 630 corresponds to the alternating PSM design. In FIG. 6U, dry etching has been performed through the quartz layer 602. This completely forms the deep trenches 620 and 622 of the PSM 600 that were previously initially formed. This also completely forms the shallow trenches 632, 634, and 636 of the PSM 600.

Figure 6V:
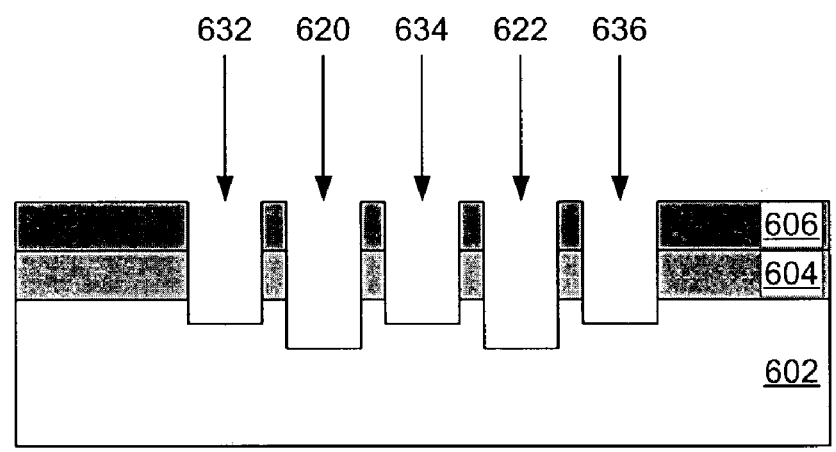

Referring back to FIG. 5B, the photoresist layer that was most recently applied is finally removed (542), such as via photoresist stripping. Performance of 542 is shown illustratively with reference to FIG. 6V. In FIG. 6V, the photoresist layer 626 of FIG. 6U has been removed. The resulting PSM 600 in FIG. 6V has deep trenches 620 and 622, and shallow trenches 632, 634, and 636. Thus, the PSM 600 is a dual-trench alternating PSM.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method for fabricating a dual-trench alternating phase shift mask (PSM) comprising:
    patterning an opaque layer over a mask layer over a transparent layer of the PSM according to a semiconductor design;
    first dry etching the mask layer according to deep trenches of an alternating PSM design to remove the mask layer from the deep trenches of the alternating PSM design;
    first dry etching a first plurality of times the transparent layer through a first photoresist layer applied over the opaque layer and patterned according to the deep trenches of the alternating PSM design by using backside exposure, to initially form deep trenches of the PSM;
    second dry etching the mask layer according to shallow trenches of the alternating PSM design to remove the mask layer from the shallow trenches of the alternating PSM design;
    second dry etching a second plurality of times the transparent layer through a second photoresist layer applied over the opaque layer and patterned according to the shallow trenches and the deep trenches of the alternating PSM design by using backside exposure, to completely form shallow trenches and the deep trenches of the PSM; and
    wherein first dry etching the first plurality of times the transparent layer comprises first dry etching the transparent layer sixty degrees for each of the first plurality of times.

2. The method of claim 1, wherein first dry etching the first plurality of times the transparent layer comprises, for each of the first plurality of times:
    applying the first photoresist layer over the opaque layer;
    backside ultraviolet exposing the first photoresist layer;
    developing the first photoresist layer to remove exposed parts of the first photoresist layer; and,
    dry etching the transparent layer through the exposed parts of the first photoresist layer to initially form the deep trenches of the PSM.

3. The method of claim 1, wherein the opaque layer comprises a chromium layer.

4. The method of claim 1, wherein the transparent layer comprises a quartz layer.

5. The method of claim 1, wherein the mask layer comprises a molybdenum silicon oxide (MoSiO) layer.

6. The method of claim 1, wherein patterning the opaque layer comprises:
    applying a photoresist layer over the opaque layer;
    exposing the photoresist layer according to the semiconductor design;
    developing the photoresist layer to remove exposed parts of the photoresist layer;
    etching the opaque layer through the exposed parts of the photoresist layer; and,
    removing the photoresist layer remaining.

7. The method of claim 6, wherein exposing the photoresist layer according to the semiconductor design comprises e-beam writing the semiconductor design on the photoresist layer.

8. The method of claim 1, wherein first dry etching the mask layer comprises:
    applying a photoresist layer over the opaque layer;
    exposing the photoresist layer according to the deep trenches of the alternating PSM design;
    developing the photoresist layer to remove exposed parts of the photoresist layer; and,
    dry etching the mask layer through the exposed parts of the photoresist layer.

9. The method of claim 6, wherein exposing the photoresist layer according to the deep trenches of the alternating PSM design comprises e-beam writing the deep trenches of the alternating PSM design on the photoresist layer.

10. The method of claim 1, wherein second dry etching the second plurality of times the transparent layer comprises, for each of the second plurality of times:
    applying the second photoresist layer over the opaque layer;
    backside ultraviolet exposing the second photoresist layer;
    developing the second photoresist layer to remove exposed parts of the second photoresist layer; and,
    dry etching the transparent layer through the exposed parts of the second photoresist layer to completely form the shallow trenches and the deep trenches of the PSM.

11. The method of claim 10, further comprising removing the second photoresist layer.

12. A method for fabricating a dual-trench alternating phase shift mask (PSM) comprising:

patterning an opaque layer over a mask layer over a transparent layer of the PSM according to a semiconductor design;

first dry etching the mask layer according to deep trenches of an alternating PSM design to remove the mask layer from the deep trenches of the alternating PSM design;

first dry etching a first plurality of times the transparent layer through a first photoresist layer applied over the opaque layer and patterned according to the deep trenches of the alternating PSM design by using backside exposure, to initially form deep trenches of the PSM;

second dry etching the mask layer according to shallow trenches of the alternating PSM design to remove the mask layer from the shallow trenches of the alternating PSM design;

second dry etching a second plurality of times the transparent layer through a second photoresist layer applied over the opaque layer and patterned according to the shallow trenches and the deep trenches of the alternating PSM design by using backside exposure, to completely form shallow trenches and the deep trenches of the PSM; and wherein second dry etching the mask layer comprises:
applying a photoresist layer over the opaque layer, such that the deep trenches of the PSM that have been initially formed are filled;
etching back the photoresist layer so that only the photoresist layer in the deep trenches remains;
dry etching the mask layer to remove the mask layer from the shallow trenches of the alternating PSM design; and,
removing the photoresist layer remaining in the deep trenches.

13. A method for fabricating a dual-trench alternating phase shift mask (PSM) comprising:

patterning an opaque layer over a mask layer over a transparent layer of the PSM according to a semiconductor design;

first dry etching the mask layer according to deep trenches of an alternating PSM design to remove the mask layer from the deep trenches of the alternating PSM design;

first dry etching a first plurality of times the transparent layer through a first photoresist layer applied over the opaque layer and patterned according to the deep trenches of the alternating PSM design by using backside exposure, to initially form deep trenches of the PSM;

second dry etching the mask layer according to shallow trenches of the alternating PSM design to remove the mask layer from the shallow trenches of the alternating PSM design;

second dry etching a second plurality of times the transparent layer through a second photoresist layer applied over the opaque layer and patterned according to the shallow trenches and the deep trenches of the alternating PSM design by using backside exposure, to completely form shallow trenches and the deep trenches of the PSM; and wherein second dry etching the second plurality of times the transparent layer comprises second dry etching the transparent layer sixty degrees for each of the second plurality of times.

* * * * *